GASKET FOR PRINTED CIRCUIT BOARD

Filed Feb. 3, 1958

INVENTORS.
BENJAMIN E. BAILEY
SAM L. DELL ACQUA
BY
Knox & Knox

United States Patent Office 2,967,284
Patented Jan. 3, 1961

2,967,284

GASKET FOR PRINTED CIRCUIT BOARD

Benjamin E. Bailey and Sam L. Dell'Acqua, San Diego, Calif., assignors to Ryan Aeronautical Co., San Diego, Calif.

Filed Feb. 3, 1958, Ser. No. 713,008

4 Claims. (Cl. 339—17)

The present invention relates generally to electrical printed circuit components and more particularly to a moisture sealing gasket for printed circuit boards.

Present electronic equipment often utilizes replaceable units in the form of printed circuit boards each comprising a sub-circuit or unit of the whole. These units comprise a flat plate or board of non-conductive material on which the circuit is printed in metallic foil or the like, the associated electrical components being integral with the circuit or mounted directly on the board. For convenience of servicing, these boards have integral terminal connections at one end and are plugged into suitable sockets mounted permanently in the electronic assembly. In such installations moisture condensation on the circuit boards tends to flow into the sockets and an accumulation of condensate may cause short circuiting.

The primary object of this invention, therefore, is to provide a moisture-proof gasket for attachment to a printed circuit board to effect a moisture insulating seal as between the board and the socket member in which the board is inserted and to prevent condensation moisture on the circuit board from entering the socket.

Another object of this invention is to provide a gasket having integral stiffening elements to ensure effective, uniform sealing along its full length and to add to the ruggedness and durability of the structure.

Another object of this invention is to provide a gasket which is sealed to the circuit board and supported in a novel manner without interfering with the circuitry or operation of the board.

Still another object of this invention is to provide a gasket which may be applied to many types and sizes of circuit boards or the like to exclude moisture from their connection assemblies.

Finally, it is an object to provide a gasket of the aforementioned character which is simple and convenient to use and which will give generally efficient and durable service.

With these and other objects definitely in view, this invention consists in the novel construction, combination and arrangement of elements and portions, as will be hereinafter fully described in the specification, particularly pointed out in the claims, and illustrated in the drawing which forms a material part of this disclosure, and in which:

Similar characters of reference indicate similar or identical elements and portions throughout the specification and throughout the views of the drawing.

Figures 1, 2, 3, 4:
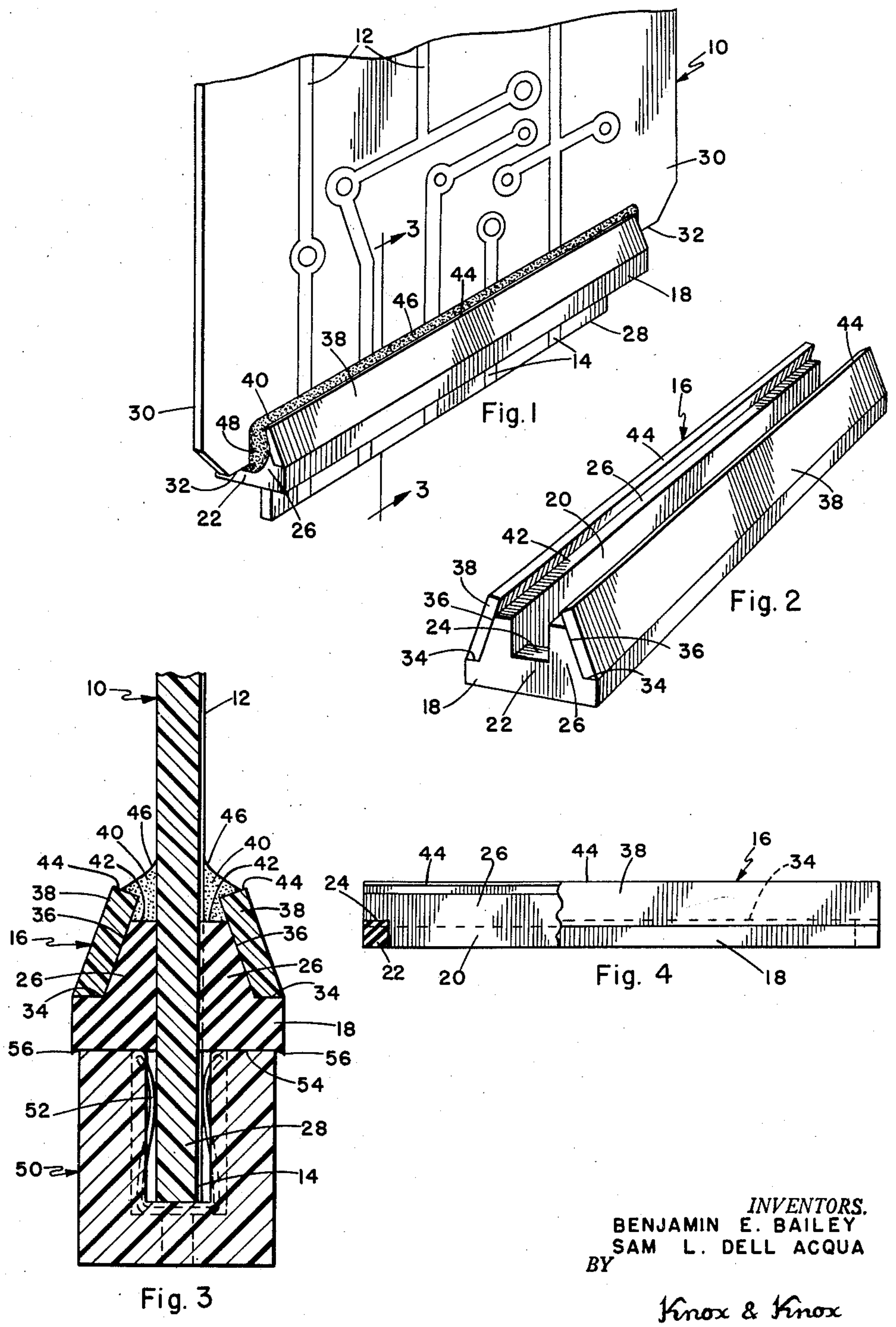
Figure 1 is a perspective view of the terminal end of a printed circuit board with the gasket attached.
Figure 2 is a slightly enlarged perspective view of the gasket.
Figure 3 is an enlarged sectional view taken on the line 3—3 of Figure 1, a socket element being indicated in section also to illustrate the sealing of the gasket thereto.
Figure 4 is a side elevation view of the gasket, one end being shown cut away.

Referring now to the drawing in detail, the circuit board 10 is a flat sheet of non-conductive material such as Bakelite, plastic, or the like, on which an electrical circuit 12 is printed by any conventional method, the circuit having integral terminal strips 14 extending to one edge of said board which will hereinafter be referred to as the terminal carrying edge portion.

The gasket 16 comprises a generally rectangular block 18 of resilient material having a longitudinal slot 20 extending vertically through the block for substantially the entire length thereof, the ends of said slot being enclosed by end walls 22. The upper portions of the end walls 22 are cut away to define notches 24, so that the block may be likened to a pair of spaced, parallel side members 26 interconnected at both ends by the end walls 22 which extend for a portion of the depth of the side members. The width of the slot 20 is such that the terminal carrying edge portion 28 of the circuit board 10 fits tightly therein, the extended side portions 30 of said circuit board fitting into the notches 24 with the lower edges 32 of said side portions resting on the upper surfaces of the end walls 22. The material from which the block 18 is made is, of course, electrically non-conductive and definitely resilient. It has been found that silicone rubber material is especially suitable due to its resistance to environmental changes, although many other materials may be used according to requirements.

To provide sufficient rigidity for the block 18 and ensure a perfect seal, the outer surfaces of the side members 26 have longitudinal recesses 34 in the upper portions thereof, the opposed faces 36 of said recesses sloping inwardly toward the upper edges of the side members. Mounted in the recesses 34 are elongated back-up plates 38 of substantially rigid material, preferably non-conductive, such as Bakelite or a suitable plastic, and these back-up plates extend upwardly above the side members 26. The back-up plates 38 may be molded integrally with the block 18 or may be bonded thereto in a suitable manner.

The gasket 16 is secured to the circuit board 10 by means of a non-conductive cement material, such as epoxy resin or the like, as indicated at 40. With particular reference to the disclosure in Figure 3, it will be observed that a longitudinal well or channel 42 is formed between the circuit board 10 and the extended upper edge 44 of each back-up plate 38, above the corresponding side member 26. The cement material 40 is applied to the upper edges 44 of both back-up plates 38 along their full length and is allowed to fill in the channels 42 and form small fillets 46 between said upper edges and the circuit board 10. Due to the inward slope of the back-up plates 38, the channels 42 are tapered in cross section with their maximum width at the base and the cement contained therein is in the form of a wedge which further assures against removal of the gasket 16 from the circuit board 10. To complete the seal, a further fillet 48 of the cement 40 is applied at each end of the gasket 16 to seal the junctions of the side members 26 and the circuit board 10 and the junctions of the lower edges 32 with the end walls 22.

The terminal carrying edge portion 28 of the circuit board 10 is inserted into a conventional socket member 50, so that the terminal strips 14 are in electrical contact with the internal connector elements 52 in said socket member. It should be understood that these circuit boards are normally clamped tightly into place by bolted-down covers or other clamping devices to prevent their inadvertent removal. In such an assembly the circuit board 10 is pressed into the socket member 50, so that the block 18 is clamped firmly against the rim 54 of said socket member. The gasket 16 is dimensioned so that the block 18 is slightly wider and longer than the socket member 50 and, when pressed into place, provides an overhanging lip 56 at each side and end of the socket member, as best illustrated in Figure 3. Any moisture condensing on the circuit board 10 is thus diverted over the outside of the gasket 16 and shed from the lips 56 instead of entering the socket member 50.

When using a material such as silicone rubber for the block 18, the back-up plates 38 serve a dual purpose by providing an effective bonding surface for the cement 40 to adhere to, in addition to their pressure equalizing and their function in providing ruggedness and rigidity. This bonding surface is necessary since conventional cements will not adhere permanently and firmly to rubber or like material containing silicone. However, when using other materials, various cements may be used and, in fact, the gasket may be molded directly on the circuit board together with the integral back-up plates.

It is understood that minor variation from the form of the invention disclosed herein may be made without departure from the spirit and scope of the invention, and that the specification and drawing are to be considered as merely illustrative rather than limiting.

We claim:

1. A printed circuit board having opposed faces of considerable area and a flat terminal carrying edge portion securable in a socket member, and a moisture proof gasket secured to said printed circuit board; said gasket comprising an elongated block of substantially resilient, non-conductive material having a longitudinal slot through which the terminal carrying edge portion of the circuit board is fitted; said terminal carrying edge portion having a socket engaging portion extending beyond said gasket; said block being shaped for close contact with said opposed faces adjacent the terminal carrying edge portion of the circuit board; and a non-conductive cement material bonding said block to said opposed faces adjacent to said terminal carrying edge portion.

2. A printed circuit board having opposed faces of considerable area and a flat terminal carrying edge portion securable in a socket member, and a moisture proof gasket secured to said printed circuit board; said gasket comprising an elongated block of substantially resilient, non-conductive material having a longitudinal slot through which the terminal carrying edge portion of the circuit board is fitted; said terminal carrying edge portion having a socket engaging portion extending beyond said gasket; said block being shaped for close contact with said opposed faces adjacent the terminal carrying edge portion of the circuit board; back-up plates of substantially rigid non-conductive material secured to opposed sides of said block and extending longitudinally thereof; and a non-conductive cement material bonding said block to said opposed faces adjacent to said terminal carrying edge portion and to said back-up plates.

3. A printed circuit board having opposed faces of considerable area and a flat terminal carrying edge portion securable in a socket member, and a moisture proof gasket secured to said printed circuit board; said gasket comprising an elongated block of substantially resilient, non-conductive material having a longitudinal slot through which the terminal carrying edge portion of the circuit board is fitted; said terminal carrying edge portion having a socket engaging portion extending beyond said gasket; said block being shaped for close contact with said opposed faces adjacent the terminal carrying edge portion of the circuit board and being dimensionally slightly larger than the socket member to overlap the edges thereof; a pair of back-up plates of substantially rigid, non-conductive material rigidly secured on opposed longitudinal sides of said block, said back-up plates being angularly disposed and having opposed edge portions closely adjacent to said opposed faces adjacent to said terminal carrying edge portion of the circuit board; and a non-conductive cement material bonding said edge portions of the back-up plates and the edge of said block to adjacent portions of the circuit board.

4. A printed circuit board having opposed faces of considerable area and a flat terminal carrying edge portion securable in a socket member, and a moisture proof gasket secured to said printed circuit board; said gasket comprising an elongated block of substantially resilient, non-conductive material having a longitudinal slot through which the terminal carrying edge portion of the circuit board is fitted; said terminal carrying edge portion having a socket engaging portion extending beyond said gasket; said block being shaped for close contact with said opposed faces adjacent the terminal carrying edge portion of the circuit board and being dimensionally slightly larger than the socket member to overlap the edges thereof; a pair of back-up plates of substantially rigid, non-conductive material rigidly secured on opposed longitudinal sides of said block, said back-up plates being angularly disposed and having opposed edge portions extending beyond said block closely adjacent to adjacent portions of the circuit board and defining longitudinal channels, substantially wedge-shaped in cross section between said edge portions of the back-up plates and the adjacent portions of the circuit board; and a non-conductive cement material filling said channels and bonding said back-up plates and said block to said adjacent portions of the circuit board.

References Cited in the file of this patent

UNITED STATES PATENTS

| | | |
|---|---|---|
| 2,693,584 | Pifer | Nov. 2, 1954 |
| 2,748,321 | Kamm | May 29, 1956 |
| 2,813,922 | Arnold | Nov. 19, 1957 |
| 2,840,676 | King | June 24, 1958 |

FOREIGN PATENTS

| | | |
|---|---|---|
| 725,032 | Great Britain | Mar. 2, 1955 |